United States Patent
Choudhary et al.

(10) Patent No.: US 8,427,502 B2
(45) Date of Patent: Apr. 23, 2013

(54) CONTEXT-AWARE NON-LINEAR GRAPHIC EDITING

(75) Inventors: Parag Choudhary, Noida (IN); Hitesh Mohan Kumar, Noida (IN); Abha Jain, Noida (IN)

(73) Assignee: Cadence Design Systems, Inc., San Jose, CA (US)

(*) Notice: Subject to any disclaimer, the term of this patent is extended or adjusted under 35 U.S.C. 154(b) by 1204 days.

(21) Appl. No.: 12/188,997

(22) Filed: Aug. 8, 2008

(65) Prior Publication Data
US 2010/0037136 A1 Feb. 11, 2010

(51) Int. Cl.
*G06T 11/60* (2006.01)
(52) U.S. Cl.
USPC .......................... 345/619; 345/647
(58) Field of Classification Search ........................ None
See application file for complete search history.

(56) References Cited

U.S. PATENT DOCUMENTS

| | | | |
|---|---|---|---|
| 7,013,028 B2* | 3/2006 | Gont et al. | 382/113 |
| 7,106,349 B2* | 9/2006 | Baar et al. | 345/647 |
| 7,259,729 B2* | 8/2007 | Shastri et al. | 345/1.3 |
| 2008/0238947 A1* | 10/2008 | Keahey et al. | 345/666 |
| 2008/0282212 A1* | 11/2008 | Dennison et al. | 716/10 |

OTHER PUBLICATIONS

Allan Wright, "FreePCB User Guide", Apr. 14, 2007, Version 1.4.*
Sarkar, M., Snibble, S. S., Tversky, O. J., Reiss, S. P., "Stretching the rubber sheet: a metaphor for viewing large layouts on small screens", Nov. 3-5, 1993, Proc. Symp. User Interface Software and Technology (ACM, 1993) p. 81-91.*
EmailCorrespondence_Applicant_Examiner; Feb. 26, 2013.*
3529-50-Proposed Amended Claims_Final—Feb. 26, 2013.*
Emanuel G. Noik, 'Layout-independent Fisheye Views of Nested Graphs,' Proceedings 1993 IEEE Symposium on Visual Languages, 1993, pp. 336-341.
Frank M. Shipman III et al, 'Beyond Location: Hypertext Workspaces and Non-Linear Views,' 1999 ACM Proceedings on Hypertext and Hypermedia, 1999, pp. 121-130.
Arno Formella & Jorg Keller, 'Generalized Fisheye views of graphs,' Proceedings of Graph Drawing '95, Sep. 1995, pp. 242-253, Springer Verlag.
Manojit Sarkar & Marc H. Brown, 'Graphical Fisheye Views of Graphs,' Proceedings of the 92 ACM CHI Conference on Human Factors in Computing Sysyems, 1992, pp. 83-91.
Carl Gutwin, et al., 'Interacting with Big Interfaces on Small Screens: a Comparison of Fisheye, Zoom, and Panning Techniques,' ACM International Conference Proceeding Series; vol. 62, Proceedings of Graphics Interface 2004, 2004, pp. 145-152.
Jenifer Tidwell, 'Local Zooming,' Designing Interfaces, O'Reilly Media, Inc., 2005, pp. 184-186.

* cited by examiner

Primary Examiner — Kee M Tung
Assistant Examiner — Sing-Wai Wu
(74) Attorney, Agent, or Firm — Rosenberg, Klein & Lee

(57) ABSTRACT

A graphical editor displays graphical representations of underlying data items in a distribution of information-bearing states across a bounded region of a display. One or more of the data items are selected as belonging to a context of a user task or operation. The information-bearing states are redistributed in the bounded region of the display so that an amount of information sufficient to the task is provided through the graphical representations of the data items in the context and any space in the bounded region of the display needed to display such information is acquired by a decrease in the amount of information provided by the data items outside the context.

21 Claims, 12 Drawing Sheets

CONTEXT-AWARE NON-LINEAR GRAPHIC EDITING

BACKGROUND

The inventive concept described herein pertains to mechanisms by which user interaction with a computer system controls the presentation of display data, where such interaction is interpreted and used by a data processor or computer architecture having system level elements of computation or data processing techniques prior to use with or in a specific display system.

Editing graphical data by a user's interaction with data processing equipment has found wide application for decades. Manipulating data through graphical interfaces is intuitive for humans and thus preferred in such fields as design and analysis. However, as the amount of data being displayed becomes large, other mechanisms must be employed so that a human user may visualize the data at the desired level of detail. This poses challenges when the user also desires to visualize the entirety of the data, as well as the desired level of detail.

FIGS. 1A-1B illustrate strategies that have been developed to visualize graphical data in both global and detailed views. FIG. 1A illustrates a magnified, or zoomed-in view 110 of data presented in a separate world view 120 depicting the entirety of the data of interest to a user. FIG. 1B illustrates a zoomed-in view 130 of a region highlighted in a separate regional view 140. The skilled artisan will readily recognize the challenges posed when attempting to edit graphical data across a large region under the constraints of the separate-view paradigms illustrated in FIGS. 1A-1B.

SUMMARY

The inventive concept described herein pertains to user interaction with a computer system to control the presentation of display data, where such interaction is interpreted and used by a data processor or computer architecture having system level elements of computation or data processing techniques prior to use with or in a specific display system. Beneficially, the display data are presented and edited in a non-linear presentation environment.

Additional aspects and utilities of the present inventive concept may be achieved by providing a graphic editor apparatus having a display interface to display graphical representations of data items in a distribution of information-conveying states, a context data processor to define a context of at least one of the data items, a display data processor to render the graphical representations of the data items in another distribution of the information-conveying states, and at least one user control to modify a data item in the other distribution of the information-conveying states of the data items.

Additional aspects and utilities of the present inventive concept may also be achieved by providing a graphic editing interface including a display device having a canvas region displayed thereon to edit a plurality of graphical abstractions of data items, a processor to define a context of a graphical editing task and at least one data item associated therewith, and to render graphical abstractions of the data item in the context is displayed with greater visual prominence than the graphical abstractions of the data items outside the context and the graphical abstractions of all of the data remain visible in the canvas region, and at least one user control to modify a data item in the canvas region subsequent the graphical abstraction of to the data item in the context being displayed with greater visual prominence than the graphical abstractions of the data items outside the context.

Additional aspects and utilities of the present inventive concept may also be achieved by providing a method of editing graphic data including displaying a plurality of graphical elements in a bounded area of a display, each of the graphical elements having assigned thereto an information-conveying state to form a distribution of information-conveying states, establishing one or more of the graphical elements as belonging to a context and excluding one or more of the graphical elements from the context, modifying the distribution of information-conveying states such that the graphical elements in the context are displayed with greater visual prominence than the graphical elements outside the context and all of the graphical elements remain visible in the bounded region of the display, and modifying the graphical elements in the bounded area of the display subsequent to the modifying of the distribution of information-conveying states.

Additional aspects and utilities of the present general inventive concept will be set forth in part in the description which follows and, in part, will be obvious from the description, or may be learned by practice of the general inventive concept.

BRIEF DESCRIPTION OF THE DRAWINGS

The inventive concept disclosed herein is described in conjunction with the accompanying drawings, of which.

DETAILED DESCRIPTION

Figure 1A:
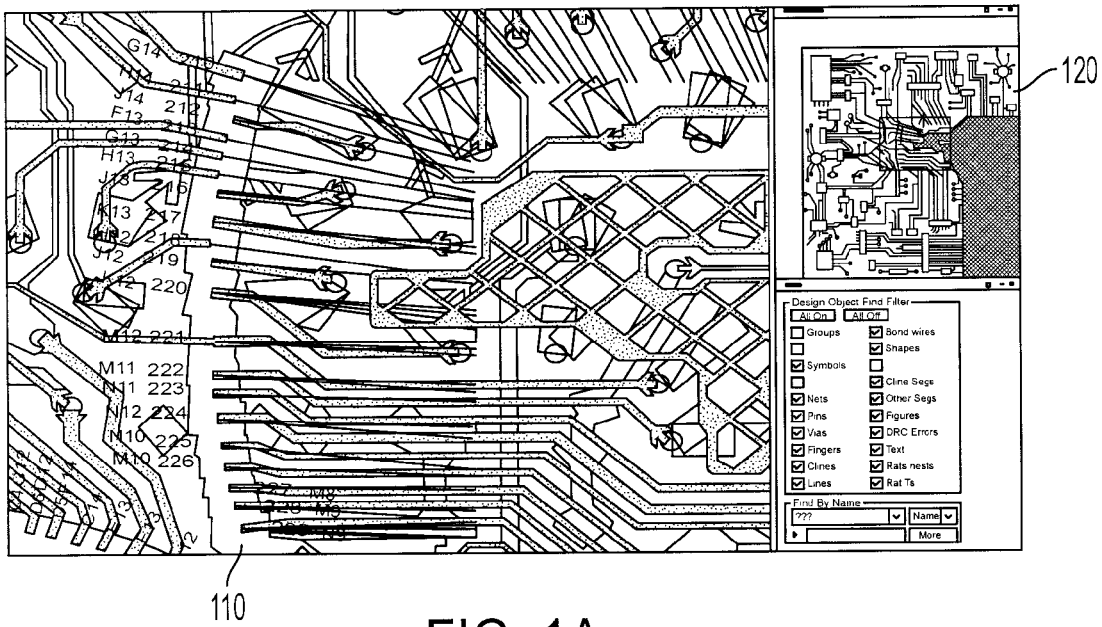
FIGS. 1A-1B are illustrations of conventional graphical data editors.
Figure 1B:
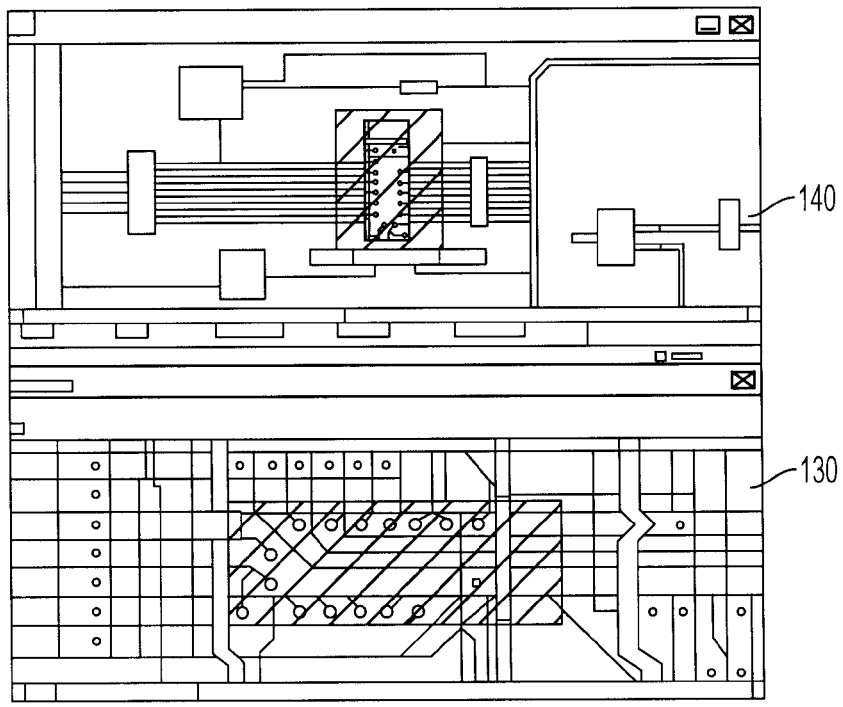

Reference will now be made in detail to the embodiments of the present general inventive concept, examples of which are illustrated in the accompanying drawings, wherein like reference numerals refer to the like elements throughout. It is to be understood that the term invention, when used herein, refers to the general inventive concept underlying the exemplary embodiments described below, and that the inventive concept is not limited to such illustrative embodiments themselves.

Figure 2A:
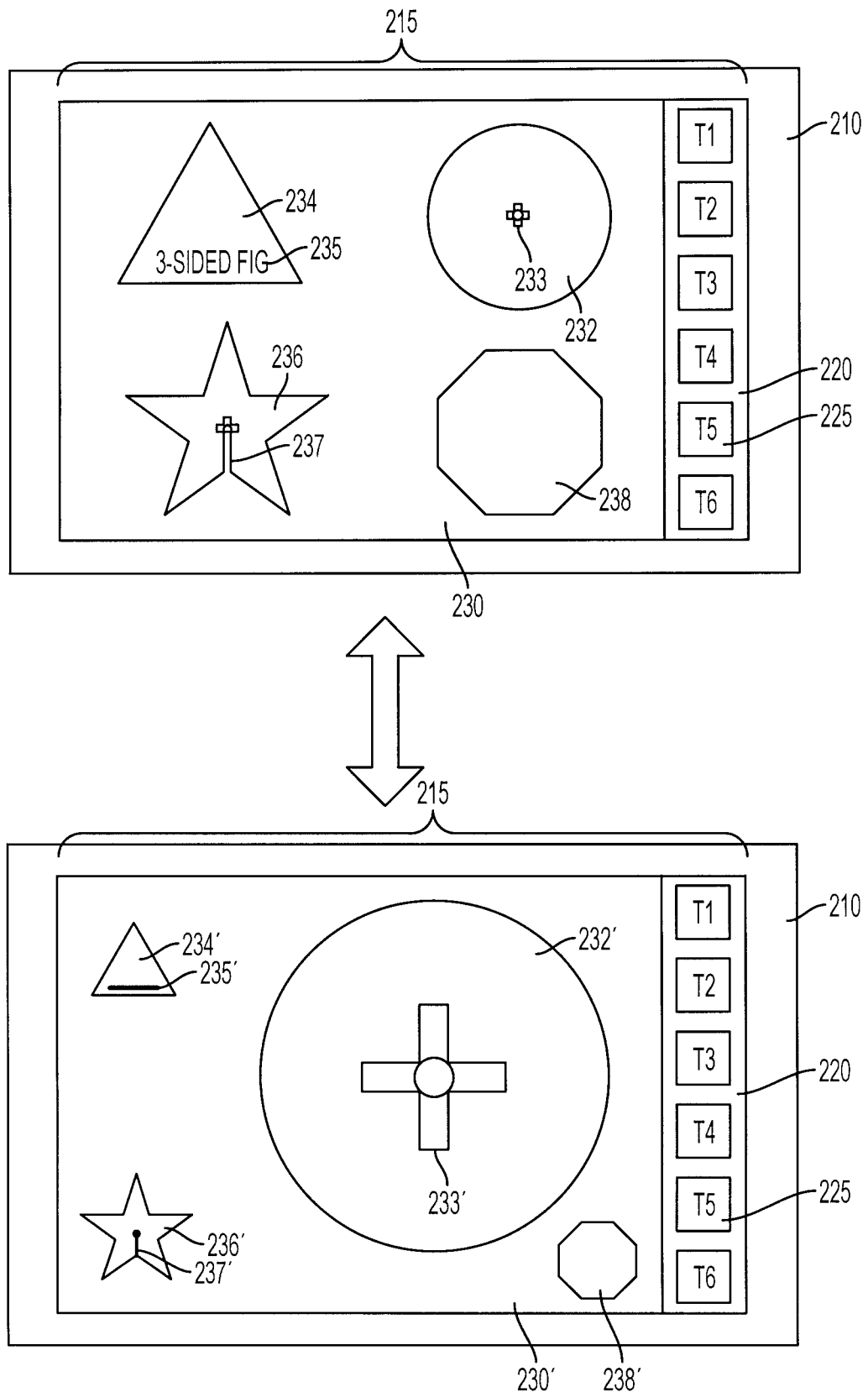
FIG. 2A is a block diagram of an exemplary graphical data editing interface embodying the present inventive concept.
Figure 2B:
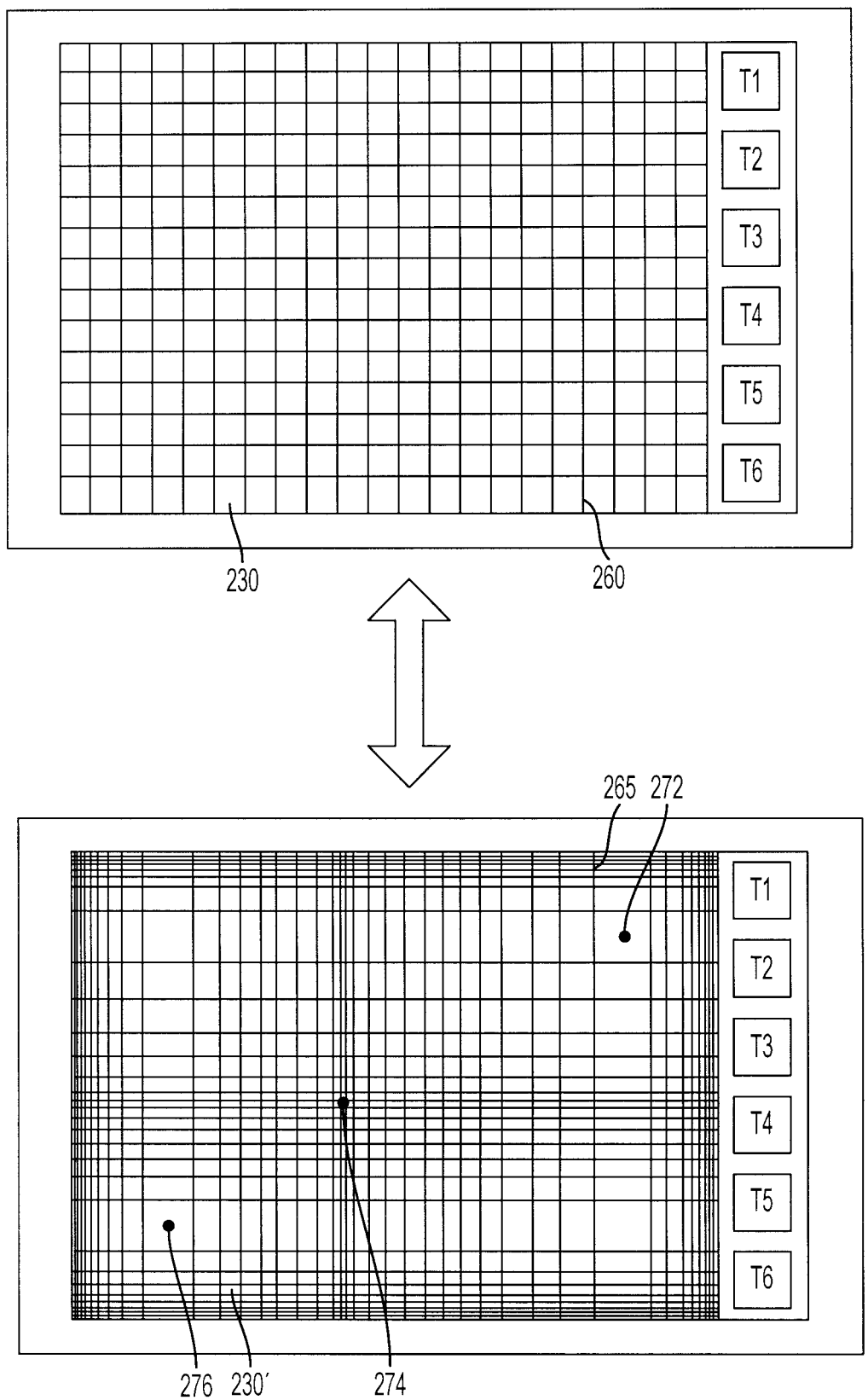
FIG. 2B is a diagram illustrating an exemplary coordinate transformation in accordance with embodiments of the present inventive concept.

Referring to FIGS. 2A-2B, there is illustrated an exemplary embodiment of the present invention. A display device 210 includes a display region 215 in which graphical data are presented to a user. The graphical data may include application-specific items, such as illustrated by toolbar 220, and display region 230, which form part of an underlying display and/or editing system. The bounded display region 230 in which the user data is displayed and selectively edited is referred to herein as a canvas 230. Additionally, the graphical data may include user-data specific items, such as illustrated in by graphical elements 232-238, which are graphical abstractions of the data of interest to a user. As used herein, a graphical abstraction is a graphical element used to represent an underlying data item in a manner that conveys meaning of the underlying data item to a user. For example, the underlying data item of graphical element 238 is an octagon, and the graphical abstraction of the octagonal data is the octagonal-shaped graphical element 238. A data item may have more than one graphical abstraction. For example, in electrical engineering, a transistor may be graphically represented by, for example, a schematic symbol, a graphical depiction of its physical construction on a circuit-bearing medium, and a footprint and pin-out of a package in which it is contained. All of these abstractions convey "transistor" to the user, but each abstraction conveys to the user different information regarding the transistor.

A data item may be modified via manipulation of characteristics of one or more graphical abstractions thereof. It is to be understood that a graphical abstraction of a data item may be viewed through a number of different states, such as zoomed-in, i.e., visually expanded, zoomed-out, i.e., visually contracted, presented in alternate coloring or shading, as well as other visual states, without a modification to the underlying data item. When a graphical abstraction is modified through a user action, the graphical abstraction will be explicitly described herein as being edited or modified, and the underlying data item may be modified in a manner corresponding to the modification of its graphical abstraction.

A user may select or define a context in which data is to be viewed, edited, analyzed, and otherwise considered. As used herein, a context is an environment, background, or setting having meaning to a user in which data can be viewed and/or modified in a manner corresponding to the environment, background or setting. For example, a particular user-action, such line drawing with a drawing tool, may define a "drawing" context. A context may be set explicitly, such as by a selection of a particular user environment or set of user environment settings, or may be selected implicitly by user action, such as selecting an editing tool or one or more data items. A context may also include one or more data items, or, equivalently, by one or more graphical abstractions thereof, involved in a particular task. The nature, number, and selection means of a context will vary by application and the present invention is not limited by the manner in which contexts are defined.

Graphical abstractions of data items belonging to a selected context may be assigned visual characteristics that correspond to the context. For example, in an Electronic Design Automation (EDA) system, the transistor described above may be presented in its schematic symbol abstraction in a "schematic entry" context and may be presented in its packaging footprint in a "component layout" context. Additional visual characteristics such as coloring, shading, magnification, among others, may be assigned to the graphical abstractions belonging to a given context, such as to highlight one or more graphical abstractions during a predetermined user action.

In addition to the visual characteristics, each graphical abstraction of a data item may be assigned an information-conveying state, which, as used herein, is a state of a graphical element that establishes an amount of information regarding the underlying data item that is conveyed by the graphical element. For example, in the upper panel of FIG. 2A, the information-conveying state of the triangular element 234 allows descriptive text 235 to be read by a user. In the lower panel of FIG. 2B, the information-conveying state of the triangular element 234' has been modified to the extent that the text 235 is no longer legible, but its presence is still conveyed to the user at element 235'.

An information-conveying state may also include how graphical features of a graphical element are defined and displayed. For example, in the upper panel of FIG. 2A, the detail 237 of the star-shaped element 237 is displayed with greater resolution than the detail 237' of the star-shaped element 237 in the lower panel of FIG. 2A. The present invention is not limited to the means by which information is conveyed by graphical elements implemented in accordance therewith, nor by the manner in which the information-conveying state of such graphical elements may change the amount of information conveyed by such graphical elements.

Referring once again to FIG. 2A, the graphical elements 232-238 on the canvas 230 may be presented on the display 210 in a non-linear editing space. As used herein, a non-linear editing space is an image viewing and editing interface whereby information-conveying states of individual graphical elements is selectively distributed over the entire interface so that certain information, e.g., task related information, is presented with greater visual prominence than other information, e.g., non-task related information. In certain embodiments of the present invention, task related information is determined by the context, whereby information of the graphical elements belonging to a context is presented in sufficient detail for the task at hand, and information outside the context is displayed in a background or superficial manner.

In certain embodiments of the present invention, the distribution of the information-conveying states of the graphical abstractions is controlled by non-linear zoom. According to non-linear zoom, graphical abstractions belonging to a context may be zoomed-in to increase the amount of information conveyed by the graphical abstraction and the graphical abstractions outside the context may be zoomed-out to decrease the amount of information conveyed by the graphical abstraction. Referring to the upper panel of FIG. 2A, the graphical abstractions of the data items, which are alternatively referred to herein simply as graphical elements, on the canvas 230 include the circular element 232 having an interior detail 233, a triangular element having text 235, a star-shaped element having detail 237, and an octagonal element 238. It is to be assumed that the circular element 232 has been selected as belonging to the context, and, as illustrated in the lower panel of the FIG. 2A, has been zoomed-in so that, for example, detail 233' may be more easily viewed and edited. The remaining graphical elements 234'-238' which are out of the defined context, are zoomed-out to accommodate the zoomed-in size of the graphical element 232'. Through non-linear zoom, the information-conveying states of the graphical elements 232-238 are distributed so that all of the graphical elements 232'-238' remain in the viewable area of the canvas 230'. Detail information, such as the text 235' and the detail 237' of graphical elements outside the context 232 are presented with diminished information content, i.e., text 235 has been reduced to a line 235', and detail 237 has been reduced to a dot 237' so that the information conveyed by the graphical element 232' in the context can be increased. The extent to which information content of the graphical elements outside the context may be diminished for display and, conversely, the extent to which information content of the graphical elements belonging to the context may be enhanced for display, may be determined by any number of factors according to the application of the present invention, as will be apparent to the skilled artisan from review of this disclosure.

Non-linear zoom may be accomplished by a transformation of coordinates of the canvas 230. For example, a Cartesian coordinates system 260 of canvas 230, as illustrated in the upper panel of FIG. 2B, may be transformed through a suitable Cartesian transform function into a second coordinate system 265 illustrated in the lower panel of FIG. 2B. The transformation of coordinates may be applied to the graphical elements 232-238 on the canvas 230 without affecting the underlying data items, which may be edited in the non-linear space created by the transformation. Non-linear zoom is an exemplary transformation by which the information-conveying states of the graphical elements 232-238 are redistributed on the canvas 230 so that any space needed to increase the amount of information conveyed by the graphical elements in the context, e.g., graphical element 232' is acquired through decreasing the amount of information conveyed by the graphical elements outside the context, e.g., graphical elements 234'-238'.

In accordance with embodiments of the present invention, the canvas 230 is zoomed according to locations of focus points 272-276. Focus points, as used herein, are coordinates of the canvas 230 about which graphical elements are expanded, such as about a positive focus point 272 or 276, or contracted, such as about a negative focus point 274. Focus points may be established on the canvas 230 according to the selected context so that graphical elements belonging to the context are magnified and the area of the canvas 230 required for such magnification is provided by contracting graphical elements outside the context as necessary.

Figure 3:
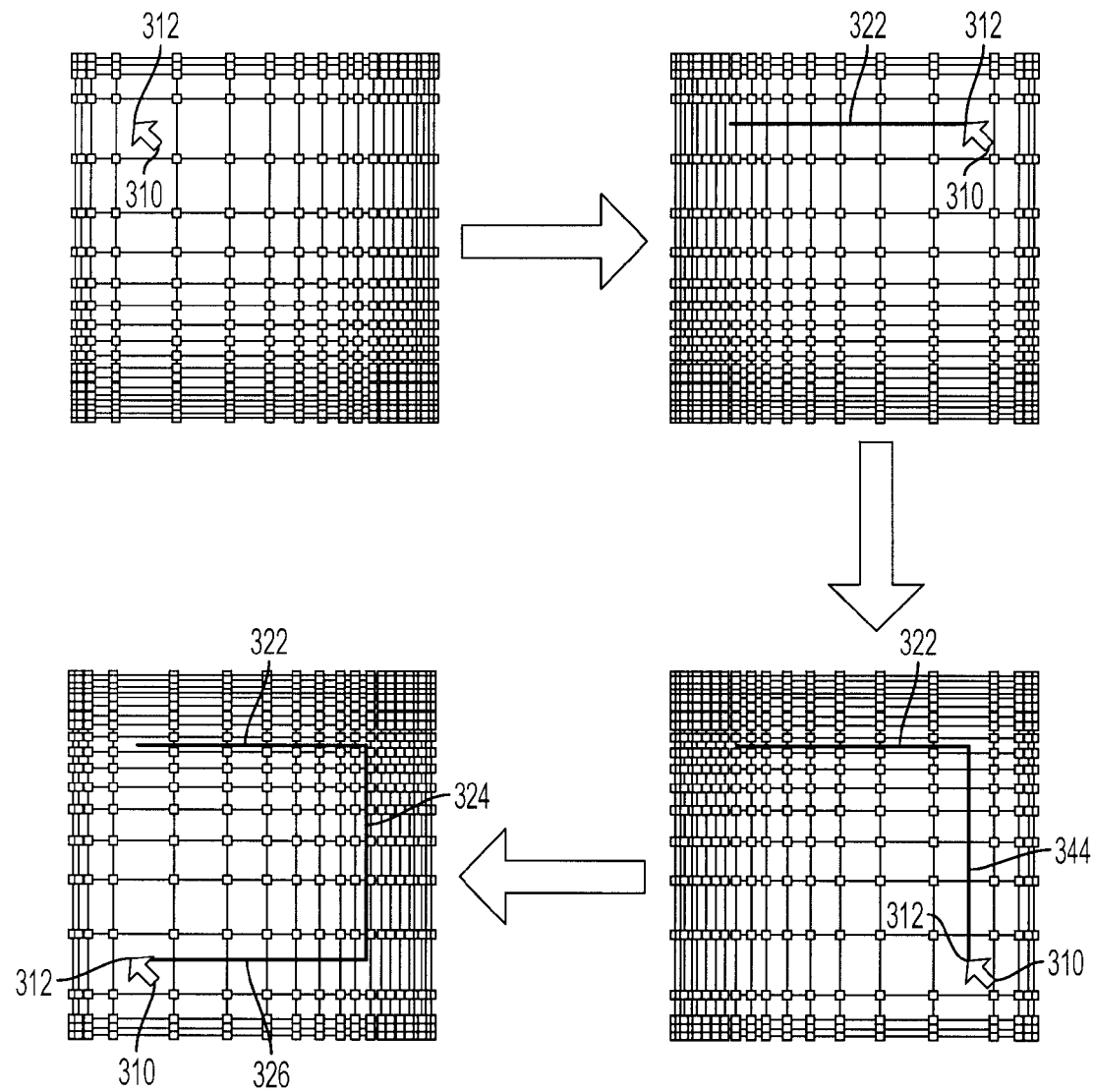
FIG. 3 is a diagram illustrating a dynamic context in accordance with embodiments of the present inventive concept.

Focus points implemented in conjunction with the present invention may be static, wherein the location thereof on the canvas 230 is fixed throughout a duration of time the context is selected, or the focus points may be dynamically updated, where the location thereof on the canvas 230 changes according to changes in the context, such as by the addition of graphical elements to the context, or by moving a location of the context from one point on the canvas 230 to another. A context that undergoes changes by way of changes to the graphical elements belonging thereto is referred to herein as a dynamic context, an example of which is illustrated in FIG. 3. As is illustrated in the figure, a drawing context is continuously changed by the sequential addition of line segments 322-326. Accordingly, the exemplary focus point is continuously updated according to a position of a cursor 310 during the task of adding the line segments 322-326. As is illustrated in FIG. 3, zoom is applied about the focus point 312 as the cursor traverses the canvas 230 during the drawing task.

In certain embodiments of the invention, static focus points may be added at any time during context operations, even in the presence of dynamic focus points. For example, if a user wants to add a static focus points during a context operation, he may do so through a suitable user action, such as a mouse click or menu selection. The present invention is not limited to the sequence by which focus points are added or deleted. Additionally, in certain embodiments of the invention, static focus points may remain active even when a dynamic focus point has been cleared, such as by the termination of a dynamic context. Subsequently, a user may have the option to remove all or some of the static focus points.

The present invention finds application at least where data is viewed and/or edited through graphical representations thereof, as will be readily recognized by the skilled artisan. As such, implementation of the present invention will vary by application thereof. Notwithstanding such variation in implementation, an exemplary EDA system embodiment of the present invention will now be described. It is to be understood, however, that the EDA system embodiment utilizes certain graphical data in a manner similar to other applications, and that the present invention may be used in other applications in a manner similar to that described below. However, it is to be understood that the description of the exemplary embodiment below is not intended to limit the scope of the present invention to EDA embodiments, or to any particular graphic editing environment.

Figure 4A:
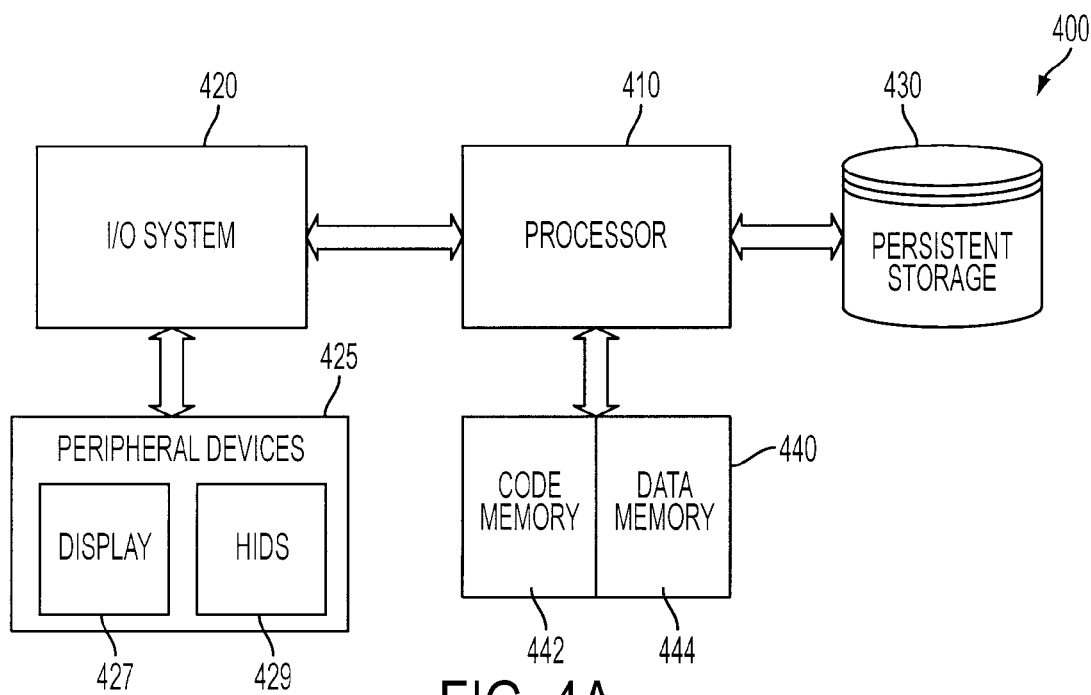
FIGS. 4A-4B are schematic block diagrams of system configurations suitable to practice the present inventive concept.

FIG. 4A illustrates an exemplary system configuration suitable to practice the invention. An exemplary data processing apparatus 400 of FIG. 4A includes an input/output (I/O) system 420, through which the data processing apparatus 400 may communicate with peripheral devices, collectively represented at block 425, and/or with external network devices (not illustrated). Among the peripheral devices 425 may be a display device 427, on which data are rendered as image data, and one or more Human Interface Devices (HIDS) 429, such as a keyboard, a mouse, a track ball, a stylus, a touch screen, a touchpad, and/or other devices suitable to provide input to the data processing apparatus 400.

The exemplary data processing apparatus 400 of the embodiment illustrated in FIG. 4A includes a processor 410 to, among other things, execute processing instructions that implement various functional modules, such as those described below with reference to FIG. 4B. It is to be understood that the present invention is not limited to a particular hardware configuration or instruction set architecture of the processor 410, which may be configured by numerous structures that perform equivalently to those illustrated and described herein. Moreover, it is to be understood that while the processor 410 is illustrated as a single component, certain embodiments of the invention may include distributed processing implementations through multiple processing elements. The present invention is intended to embrace all such alternative implementations, and others that will be apparent to the skilled artisan upon review of this disclosure.

A storage unit 440 may be utilized to store data and processing instructions on behalf of the exemplary data processing apparatus 410 of FIG. 4A. The storage unit 440 may include multiple segments, such as a code memory 442 to maintain processor instructions to be executed by the processor 410, and data memory 444 to store data, such as data structures on which the processor 410 performs data manipulation operations. The storage unit 440 may include memory that is distributed across components, to include, among others, a cache memory and a pipeline memory.

The data processing apparatus 400 may include a persistent storage system 430 to store data and processing instructions across processing sessions. The persistent storage system 430 may be implemented in a single persistent memory device, such as a hard disk drive, or may be implemented in multiple persistent memory devices, which may be interconnected by a communication network.

Figure 4B:
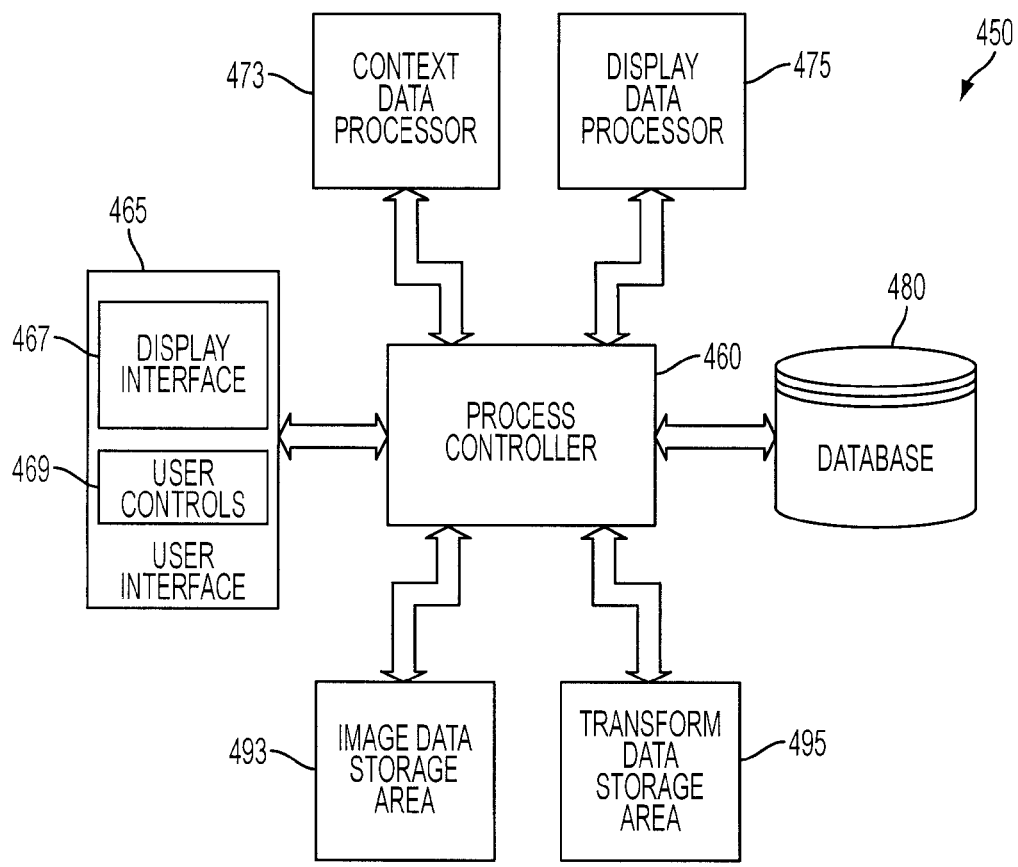

FIG. 4B illustrates an exemplary configuration of functional components suitable to practice certain embodiments of the present invention. The exemplary system illustrated in FIG. 4B may be implemented through processing instructions executed on the processor 410, and in cooperation with other components as illustrated in FIG. 4A, form an exemplary circuit design system (CDS) 450 on the exemplary data processing apparatus 400. The exemplary CDS 450 may be operated by a circuit designer to design and analyze circuit designs and to provide circuit realization data in accordance with the circuit design that is selected by the designer. The realization data may include data formatted to physically fabricate the circuit on one or more circuit-bearing media, such as data to construct component and interconnect mask patterns, component placement location data, packaging data, and any other data necessary in a fabrication process to produce the finished circuit product. The present general inventive concept is not limited by any particular fabrication process, and any suitable fabrication data format may be used with the present general inventive concept without deviating from the spirit and intended scope thereof.

The CDS 450 may include a process controller 460 to coordinate and control the interoperations of the functional components of the CDS 450 so as to achieve a fully operational data processing system. For example, the process controller 460 may receive data corresponding to user manipulations of the user interface 465 (to be described below), may format the data into a command and/or data location in memory, and may convey such information to the applicable functional module of the CDS 450. The process controller 460 may subsequently receive processed data from the applicable functional module and forward the data to another functional module, as well as to indicate such processing on the user interface 465. The process controller 460 will perform other coordination and control operations according to the implementation of the CDS 450, and such other operations, as well as the implementation of such, can be embodied by a wide range of well-known process control methods and apparatuses. The present invention is intended to encompass all such alternatives of the process controller 460, including multi-threaded and distributed process control methodologies.

As indicated above, the CDS 450 may include a user interface 465 through which the CDS 450 interacts with a user. The user interface 465 may be implemented by a combination of hardware devices and suitably programmed processing instructions executed by the processor 410. The user interface 465 may be used to present data to the user in a meaningful form on a display interface 467, such as through graphical representations of circuit schematics, circuit layout diagrams, circuit test bench interfaces, and of data management interfaces such as file directories, and other images recognized by the user. The display interface 467 may include a canvas, such as the canvas 230 described with reference to FIGS. 2A-2B. The user interface 465 may interpret user manipulations of any HIDs thereof into messages and instructions that can be recognized by the process controller 460. The user interface 465 may include a plurality of user controls 469 to afford the user interactivity with and control over the CDS 450. The user controls may include the HIDs described above, and may also include software implemented controls on the display interface 467, such as the toolbar 220 illustrated in FIG. 2A, and/or buttons, such as the button 225 illustrated in FIG. 2A, menus of commands, text command entry blocks, and other suitable software controls. The foregoing description of the user interface 465 may be met by a suitably configured graphical user interface (GUI), the implementation details of such will be omitted in the interest of conciseness.

The CDS 450 may include a database 480 of circuit objects that maintain all the data necessary to design, analyze, modify, and fabricate an electric circuit per the specifications of a circuit designer. As used herein, a circuit object is a data structure that can be stored in a memory device to contain data of a circuit element so that the circuit element can be viewed, modified, interconnected with other circuit elements, and analyzed in one or more circuit design contexts selected by a user. A circuit object may also contain graphical abstraction information so that a particular circuit element may be presented on the display interface 467, which may include a canvas 230, as, for example, a schematic symbol in a schematic entry design context, presented as a footprint in a layout design context, presented as a routing component in a circuit routing design context, and provided as a component model in a circuit analysis and design verification context. A circuit object may also be hierarchical, whereby a circuit object contains other circuit objects of circuit elements interconnected to form a component that has a schematic symbol, layout footprint, and a terminal characteristics model used as a single element in a circuit. An example of such a circuit object is that of an operational amplifier.

Image data storage area 493 is a work space in memory, such as in data memory 440, in which to store the graphical elements that are rendered onto the canvas 230 of the display interface 467. The image data storage area 490 may concurrently store multiple views of the graphical elements corresponding to, for example, an original view and a non-linear view of the canvas 230, such that the original graphic data and the non-linear graphic data may be switched rapidly. Additionally, the image data storage area 493 may concurrently store views of different image layers, or of different views of layers of circuit elements to form a graphical representation of multi-dimensional objects. The graphical data in the image data storage area 493 may be provided to the display interface 467 to be displayed on the canvas 230, and may have been first processed by the display data processor 475, as described below.

As illustrated in FIG. 4B, the exemplary CDS 450 includes a context data processor 473 to establish and process information regarding a context and the circuit objects associated therewith. The context data processor 473 may receive context defining messages from the user interface 465 through the process controller 460, such as a message that, for example, a particular user environment has been selected, that a particular task has been initiated, or that certain graphical elements have been selected. A context may be determined from, for instance, functionality defined in a circuit design. For example, a "power nets" context may be defined to include all circuit paths connected to power terminals. The power net context may be selected by a user through, for example, a suitable command provided via the user interface 465 and may be received as a suitably formatted message by the context data processor 473 through the process controller 460. Upon receiving the power net context selection command, the context data processor 473 may associate all circuit paths directly connected to a power terminal with the power net context.

Certain embodiments of the present invention may define a context automatically. For example, incorporation of a circuit element into a design may invoke a context selection corresponding to the type of element being incorporated. A circuit object of a digital logic component may have a class identifier, for example, that identifies the component as belonging to a digital integrated circuit class. When such a component is retrieved from, for example, a library in the database 480, the context data processor 473 may determine from the class identifier in the circuit object that a digital circuit is being incorporated into the design, and may then set a "digital logic" context accordingly. The context data processor 473 may then include the retrieved digital circuit component in the context. Certain embodiments of the present invention may have functionality whereby such automatic context selection can be activated and deactivated by a user, either globally and/or per individual classes of circuit elements and user-operations.

In circuit design applications, sections of an electronic component may be distributed across a view, e.g., individual gates of a digital integrated circuit or sections of a packaged circuit, as split parts. According to certain embodiments of the present invention, the context data processor 473 may establish a context that includes all sections of a split part upon selection of any of the sections of the split part. Accordingly, the information-conveying state of the graphical elements representing sections of the split part may be set to increase the information provided thereby by all of the sections of the split part across the canvas 230.

Figure 5:
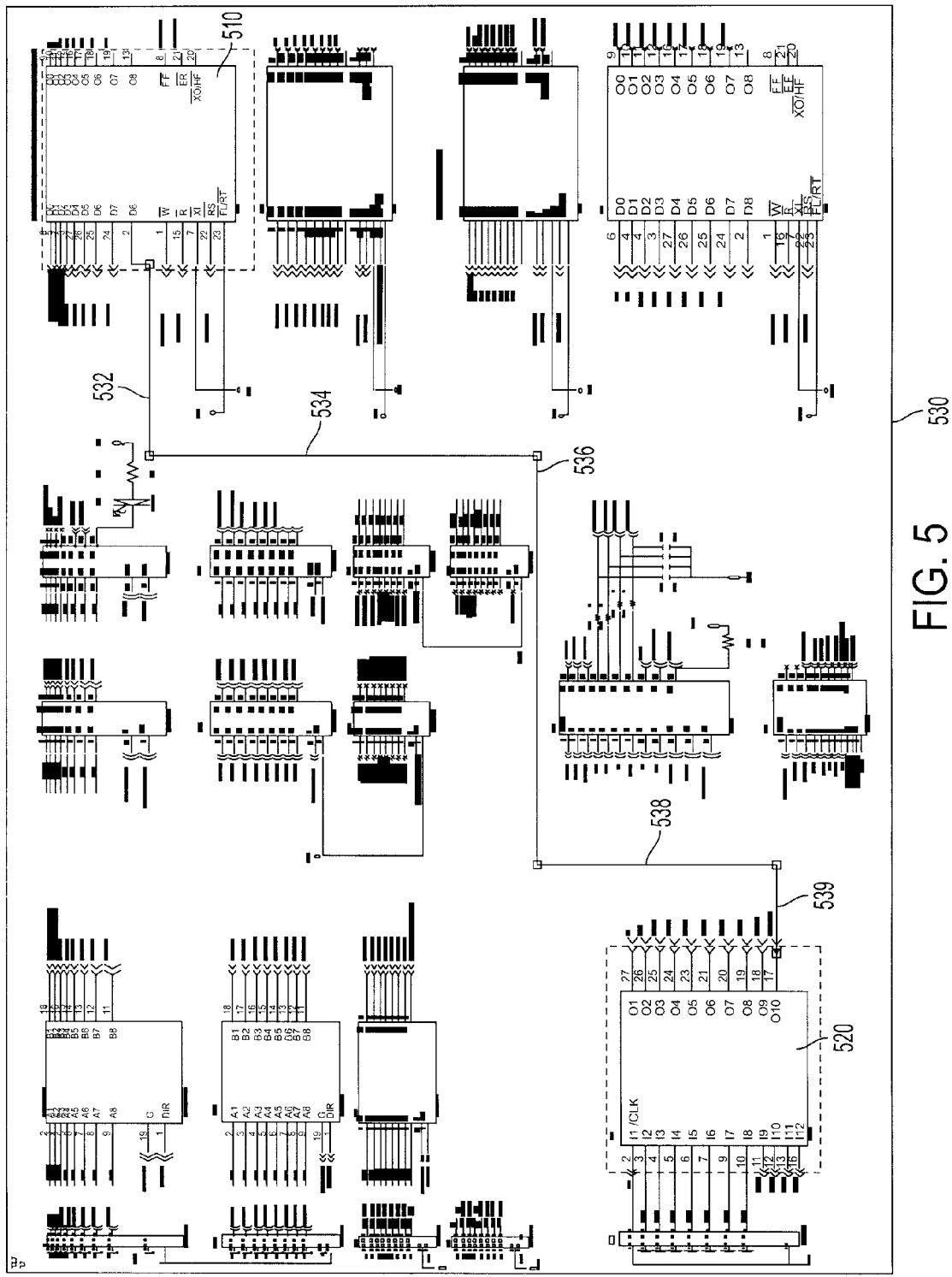
FIG. 5 is a diagram of a routing context view of an Electronic Design Automation embodiment of the present inventive concept.

As stated above, a context may also be established through a predetermined user action. In a circuit design environment, such user action may include routing an interconnection between terminals. The context data processor 473 may establish a context to include the source and destination components that are to be interconnected. Additionally, the context may include the routed interconnection itself, and the context may be dynamically updated as the interconnection is being routed. Such an example is illustrated in FIG. 5, where a source component 510 and destination component 520 are to be interconnected in a routing context. In the example of FIG. 5, the source and destination components 510 and 520, respectively, belong to the routing context and may be zoomed accordingly about static focus points. The remaining components on the canvas may be zoomed-out according to non-linear zoom. The route segments 532-539 may be added to the context as the segments are added to the design, and, as such, may be zoomed dynamically as described with reference to FIG. 3. It is to be noted that while the route is being added to the design on canvas 530, the zooming of components dynamically updates so that the complete design always stays visible on the canvas 530.

Figure 6:
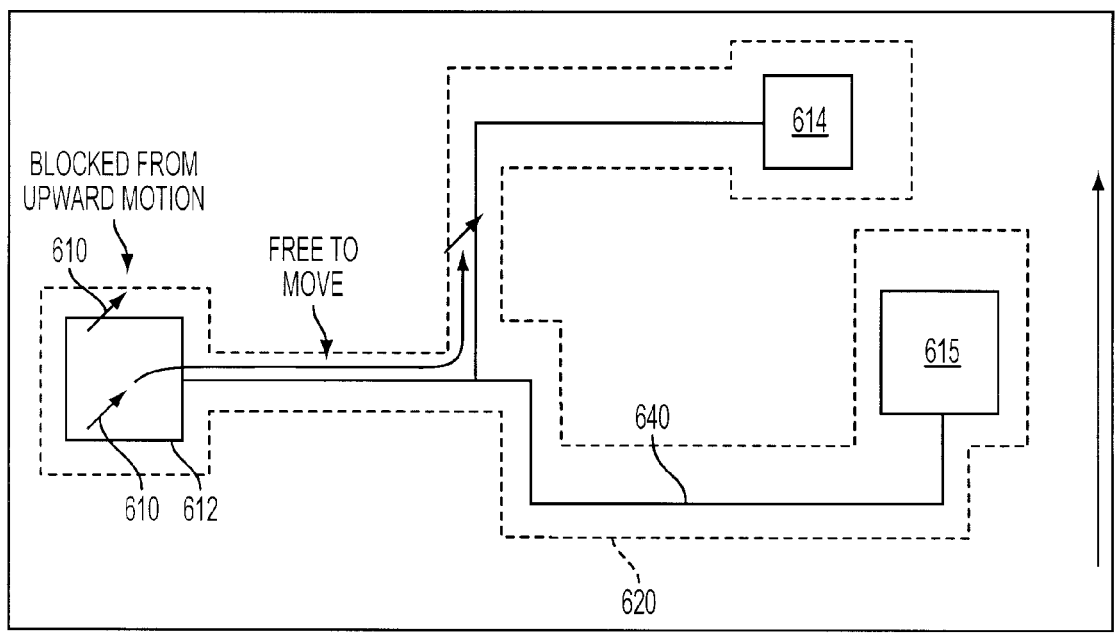
FIG. 6 is a diagram illustrating guided context traversal used in conjunction with embodiments of the present inventive concept.

In certain embodiments of the present invention, the context data processor 473 may cooperate with the user interface 465 to constrain the dynamic context to a particular region of the canvas. Referring to FIG. 6, there is illustrated a canvas 630 on which components 612-615 are displayed. It is to be assumed for purposes of demonstration that a routing context has been defined to include the components 612-615. The context data processor 473 may determine a confinement region 620, such as by computing possible routing paths and the available space in the design for such routing paths. The confinement region definition data may be provided to the process controller 460 to define a guided traversal path such that as a user adds the routing segments, representatively illustrated by routing segment 640, the cursor 610, and thereby the addition of routing segments 640 to the dynamic context, are constrained to remain in the confinement region 620. By such constraint, unintended editing outside the confinement region 620 is avoided. In certain embodiments of the invention, the guided traversal may be activated and deactivated as desired by a user.

In certain embodiments of the present invention, results of a content search, such as through a suitable search tool, are provided to the context data processor 473, and a context may be defined with the search results. For example, a search for a particular component in a design may result in not only the location of the component in the design, but the automatic creation of a context that includes the sought component.

The exemplary CDS 450 may include a display data processor 475 to render the graphical elements on the canvas 230. The display data processor 475 renders the graphical elements associated with the context determined by the context data processor 473 such that graphical elements belonging to the context are displayed with the best possible visibility while maintaining a complete view of the graphical data in which the selected context resides.

The display data processor 475 may perform non-linear zoom through, for example, a spatial transform of a coordinate system defining the canvas 230. The present invention is not limited by the transform function realized by the display data processor 475. However the function used for the transform should be invertible so that the graphical elements can be returned to their original visual state. The display data processor 475 may realize any one of several bijective functions to fulfill the transform function, and the display processor 475 may apply a separate transform function for each dimension represented on the canvas 230.

The continual evaluation of a bijective function to perform a coordinate transform may be computationally prohibitive in certain applications. For example, a context may include multiple focus points, any one of which may be dynamically updated, such as is described with reference to FIG. 3, which may require significant computational resources to perform, assuming that a suitable bijective function for such a multiple focus context even exists at all. Thus, in certain embodiments of the present invention, the coordinate transform of the canvas 230 may be performed via the application of one or more block transformations. Such block transformations can be made to encompass a limited region and can thus be applied about each focus point in the context.

In certain embodiments of the present invention, one or more transform functions may be sampled and the samples stored in memory, such as in transform data storage area 495 illustrated in FIG. 4B. For example, the sampled transform functions may be used to populate one or more respective lookup tables.

Figure 7:
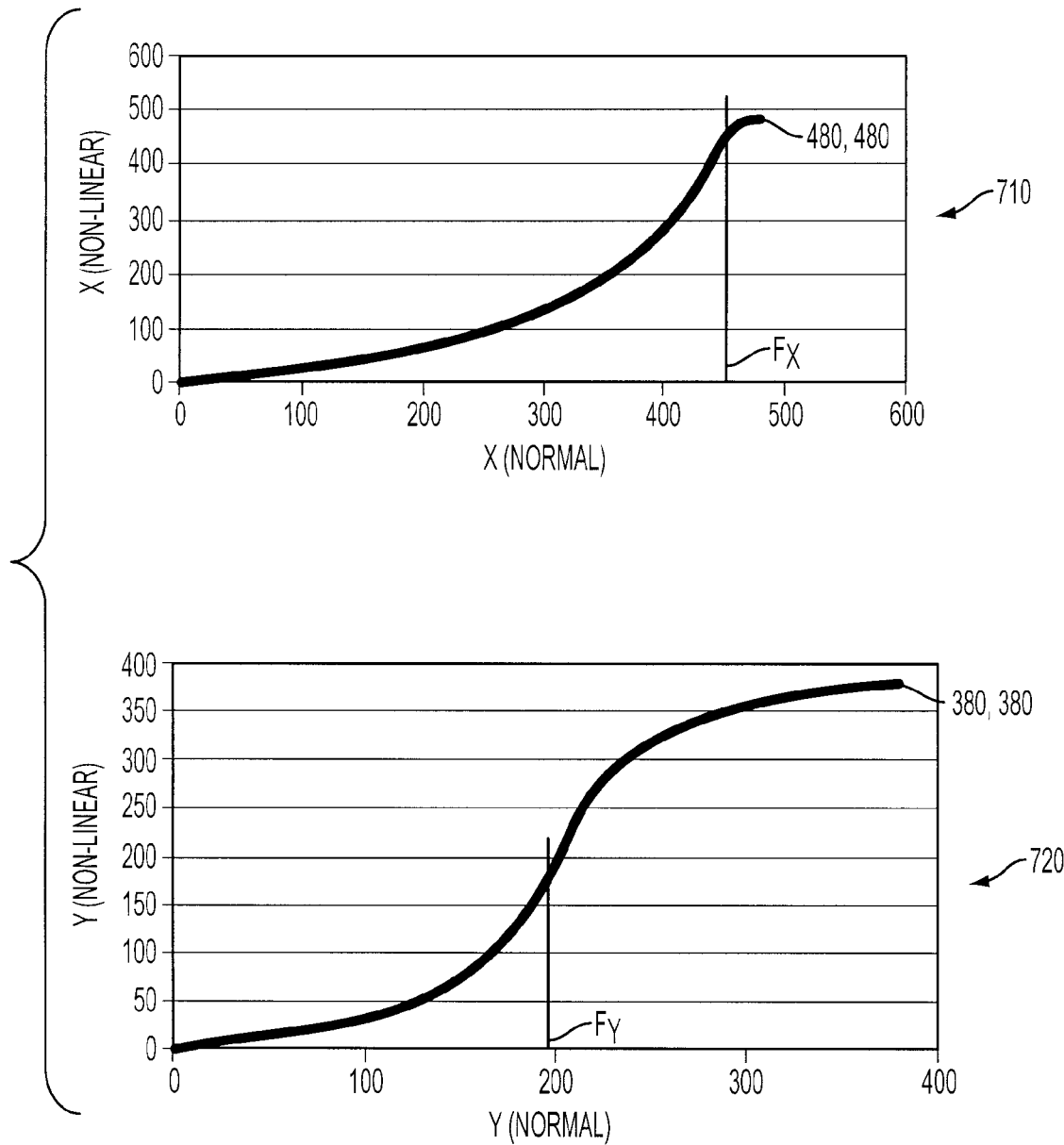
FIG. 7 is a graph depicting exemplary coordinate transformation data in accordance with embodiments of the present inventive concept.

Referring to FIG. 7, there is illustrated exemplary transform data as may be stored in lookup tables in transform data storage area 495. As is illustrated in the figure, data set 710 establishes a non-linear spatial transformation to a set of x-coordinates of the canvas 230, and data set 720 applies a separate and distinct non-linear transformation to a set of y-coordinates of the canvas 230. The lookup tables may be populated independent of one another, and may be populated at execution time according to various contexts. It is to be understood that additional data sets may be implemented with embodiments of the present invention to be applied to other display dimensions represented on the canvas 230. Any non-linear function can be used to populate these tables. However, the non-linear functions populating the lookup tables should converge at their respective boundaries such that the normal coordinate is equal to the transformed coordinate at the endpoints of the transform for each direction. For example, x-coordinate table 710 is non-linear between its boundaries 0 and 480, but is terminated at its endpoints (0, 0) and (480, 480). The y-coordinate table 720 is non-linear between its boundaries 0 and 380 and is terminated at the endpoints (0, 0) and (380, 380).

The display data processor 475 may establish focus points according to the context established by the context data processor 473 and from instructions received from user actions through the process controller 460. The present invention is not limited by a particular implementation of the display data processing functions of the display data processor 475, and any suitable function may be used with the present general inventive concept without deviating from the spirit and intended scope thereof. Any forward translation from a normal Cartesian coordinate (x, y) to the non-linear coordinate (x', y') may be achieved by accessing each table separately, and the reverse translation is achieved in similar fashion, i.e., x'=f1(x) and y'=f2(y) and, in the reverse direction, x=g1(x') and y=g2(y'), where f1, f2, g1, g2 are the transformation functions applied.

Using the exemplary transformation data illustrated in FIG. 7, a horizontal line having endpoints at normal coordinates (100, 100) and (200, 100) is mapped to a line having endpoints (25, 24) and (63, 24) in non-linear coordinates, thus maintaining its horizontal orientation on the canvas 230. Similarly, a vertical line between having endpoints at normal coordinates (100, 50) and (100, 100) is mapped to a line having endpoints (25, 13) and (25, 24) in non-linear coordinates, thus maintaining its vertical orientation.

In certain embodiments of the present invention, graphical elements belonging to a context are each assigned a focus point. The transformation data 710, 720, is aligned with each focus point of the context at the point ($F_x$, $F_y$), and the transformation is applied by, for example, converting the x-coordinates of the context about the focus points encompassed by the x-transform data and, subsequently, converting the y-coordinates encompassed by the y-transform data. When the focus points are spaced to where block transformation data overlaps, the transformed data may be superimposed to a final result. For example, if three (3) focus points exist in a context, e.g., F1, F2 and F3. If it is assumed that x'(1)=f1(x, F1), x'(2)=f1(x, F2), and x'(3)=f1(x, F3), the final value entered into the lookup table may be x'=(x'(1)+x'(2)+x'(3))/3. Similar calculations may be conducted to determine y-transform data values. Additionally, it is to be understood that different non-linear functions and magnification factors may be applied to each focus point by filling in respective lookup tables with data sampled from the applicable transform function.

The transformation data may be applied to contexts of arbitrary shape by a suitable selection of boundaries. For example, contexts having non-curved shapes can be transformed by alignment of the transformation block with vertices of the shape. Transformation of regular curved contexts, such as those of circular or elliptical shapes, may be applied across the bounding rectangle of the context. Transformation of other curved shapes may be applied by aligning the transformation blocks on end points and intermediate points of the boundary and adding a curve joining the intermediate and end points after the transformation is complete.

The display data processor 475 may perform non-linear zoom inside a view that has had non-linear zoom applied. Certain embodiments of the invention allow such recursive non-linear zoom to any zoom level, such as by storing intermediate zoom views of the canvas 230 in image data storage area 493 and applying the non-linear zoom transformation data on the stored view.

In certain embodiments of the present invention, the display data processor 475 applies other image processing to improve visual clarity of the graphical elements in the context. For example, the display data processor 475 may consider the relative importance of graphical elements in the zoomed region of the canvas 230. The relative importance of graphical data may be established through user selected environment variables, in circuit objects, or by other settings in the EDA system 450. For example, the display data processor 475 may apply distance-based weights, whereby nearby objects are zoomed-in less, compared to a distant object, which gets a higher zoom-level. The display data processor 475 may also apply a weight attached to the cursor, whereby the cursor position establishes a dynamic zoom level which changes with the position of cursor. The display data processor 475 may also implement manual specification of the zoom-level such that, depending on the context-selection, the user may specify a zoom value to a level different from that specified by a user control.

Certain embodiments of the display data processor 475 may control the display refresh rate of the canvas 230 so that a refresh does not occur for every change of dynamic focus. For example, as input is provide by an HID 429, such as a mouse, the process controller 460 may transmit mouse movement signals or messages to the display data processor 475, which may determine when the mouse has moved a distance greater than some threshold distance. When such mouse movement has been determined, only then does the display data processor 475 update the focus position on the canvas 230 and reapply the transformation data about the updated focus position.

Figure 8A:
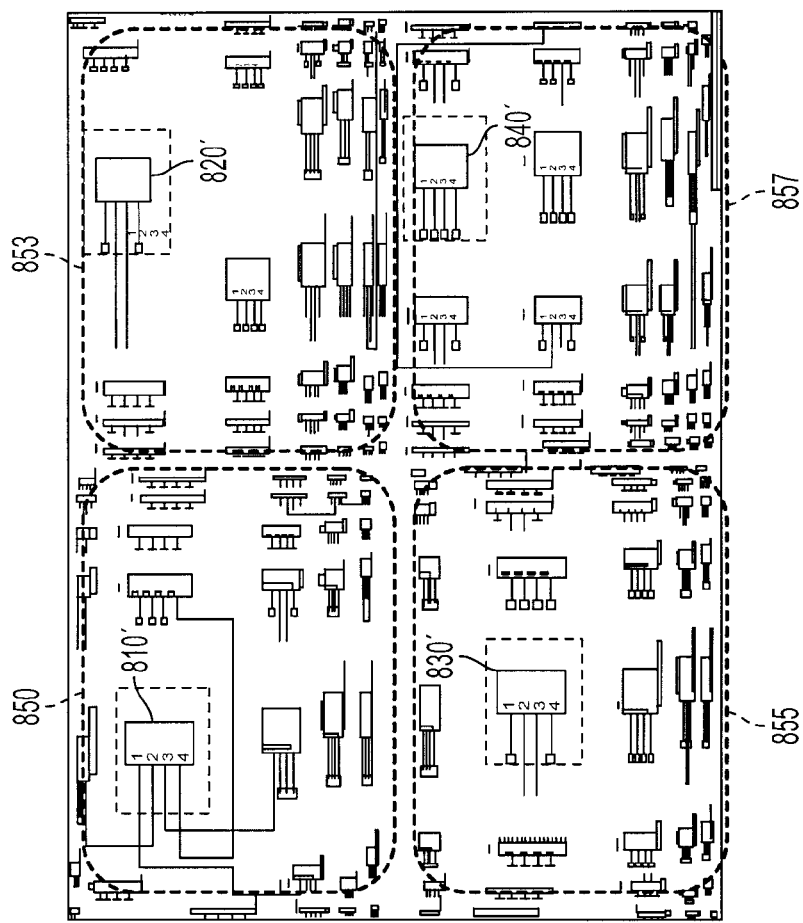
FIG. 8A is a diagram of multiple zoom window views in accordance with the present inventive concept.
Figure 8A:
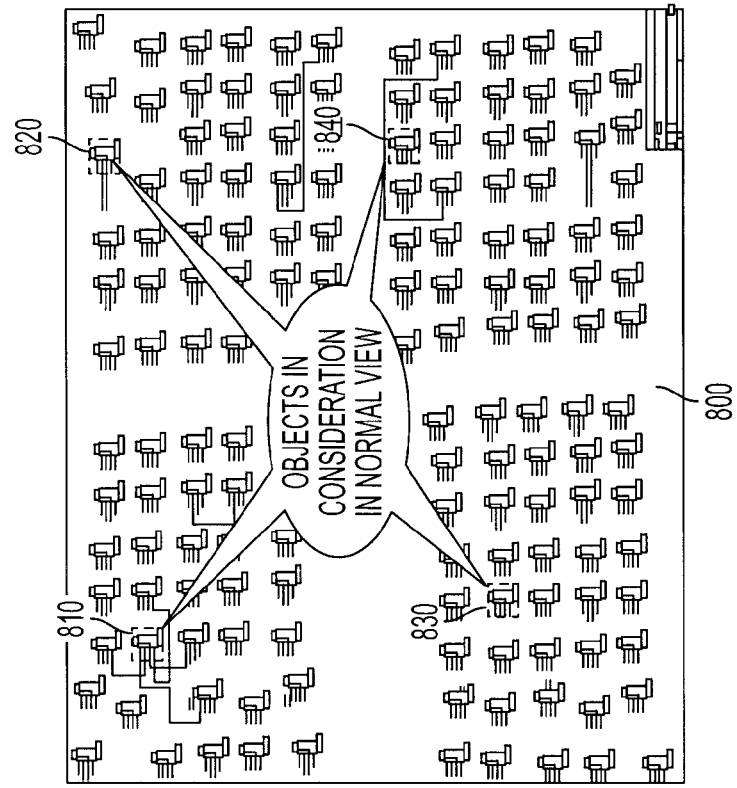

The display data processor 475 may partition the canvas 230 into separate non-linear editing spaces as is illustrated in FIG. 8A. The canvas 800 has a plurality of graphical elements disposed thereon, of which elements 810-840 belong to a routing context. In such cases, the view of the graphical data is clearer when the canvas 800 is portioned into multiple sections, such as sections 850-857, and non-linear zoom separately applied to each section. It is to be observed from FIG. 8A that the components 810'-840' are zoomed in respective sections 850-857. In certain embodiments of the present invention, a dynamic context may move between sections 850-857. The dynamic focus may impact only one section at a time, e.g., when a dynamic focus is in section 850, the transform is confined to section 850. As the dynamic focus enters a new section, such as section 852, the transform is applied to section 853. The present invention is not limited to the number of dynamic focus points, nor on the distribution thereof in separate sections 850-857.

Figure 8B:
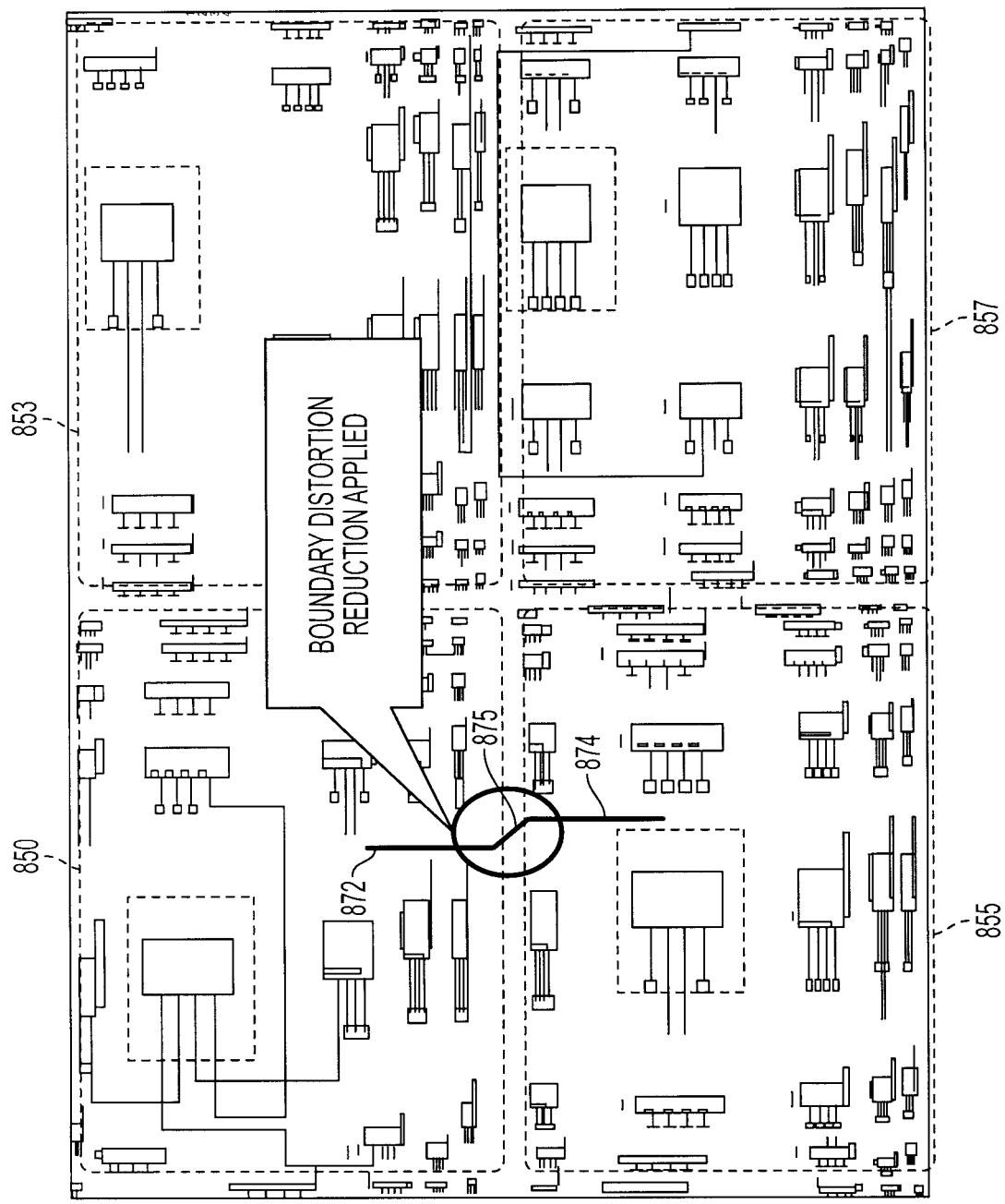
FIG. 8B is a diagram illustrating distortion reduction in multiple zoom window embodiments of the present inventive concept.

In certain embodiments of the invention, distortion is ameliorated at the boundaries of sections 850-857 by, for example, interpolation. For example, as illustrated in FIG. 8B, when a line traverses a boundary from one section 850 to another section 855, the line segments thereof 872, 874 may retain their orientations in respective sections 850, 855, and may be joined by a line segment 875 at the boundary.

Figure 9:
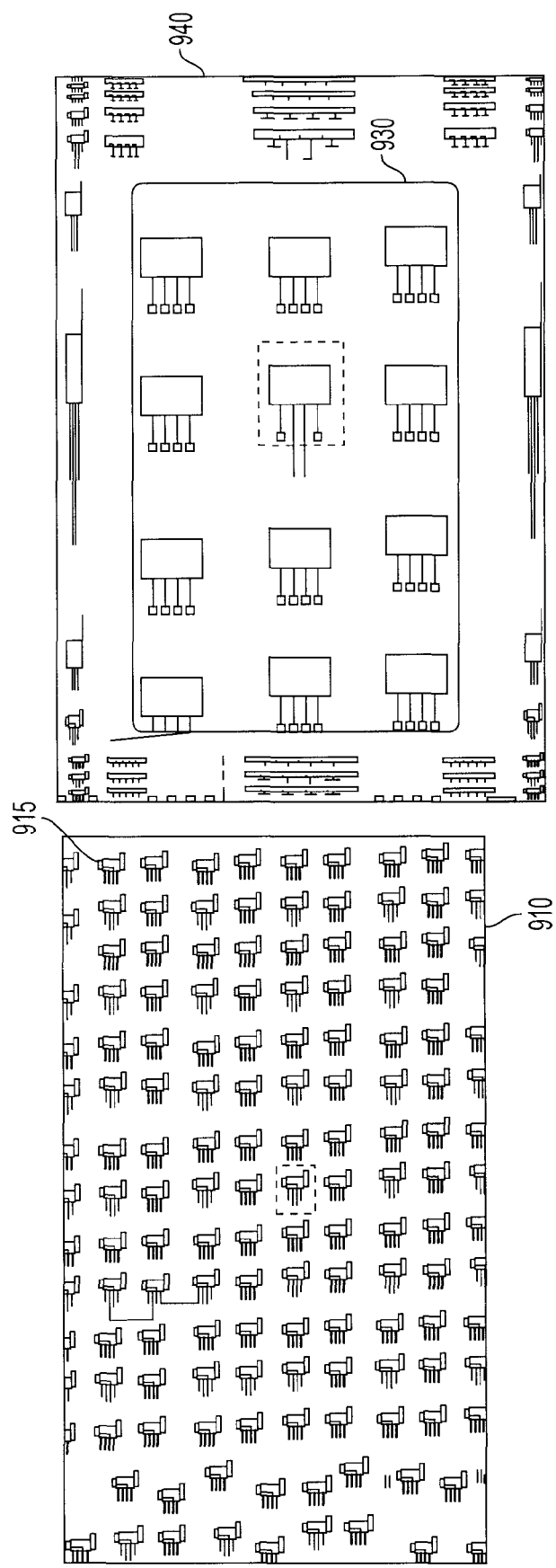
FIG. 9 is a diagram illustrating linear zoom within a non-linear zoom region in accordance with embodiments of the present inventive concept.

Referring to FIG. 9, there is illustrated a canvas 910 having disposed thereon a plurality of graphical elements representatively illustrated at component 915. As illustrated in the figure, the display data processor 475 may apply a linear zoom in a linear zoom window 930 that resides in a non-linear editing space 940.

Certain embodiments of the present invention maintain visual states of graphical elements between views, such as between non-linear views of the canvas 230 at different zoom levels, and between linear and non-linear views of the canvas 230. Such maintenance of visual states allows, for example, highlighted graphical elements of the context to remain highlighted in different views of the canvas. Additionally, the display data processor 475 may allow linear viewing operations, such as linear zoom-in, zoom-out, pan, etc., to be performed on the non-linear transformed graphical elements.

It is to be understood that although the functional compartmentalization of the exemplary embodiments of FIG. 4A-4B facilitates an understanding of the present invention through descriptions thereof, such configuration is not essential to practice the present invention. Elements other than those shown and described may be used in place thereof, functionality portrayed as being carried out in multiple elements may be combined to be carried out in a single component, and elements described as discrete may be distributed across multiple components. Indeed, numerous variations, alternatives and modifications will become apparent to the skilled artisan upon review of this disclosure and the present invention is intended to encompass such alternative configurations.

Figure 10:
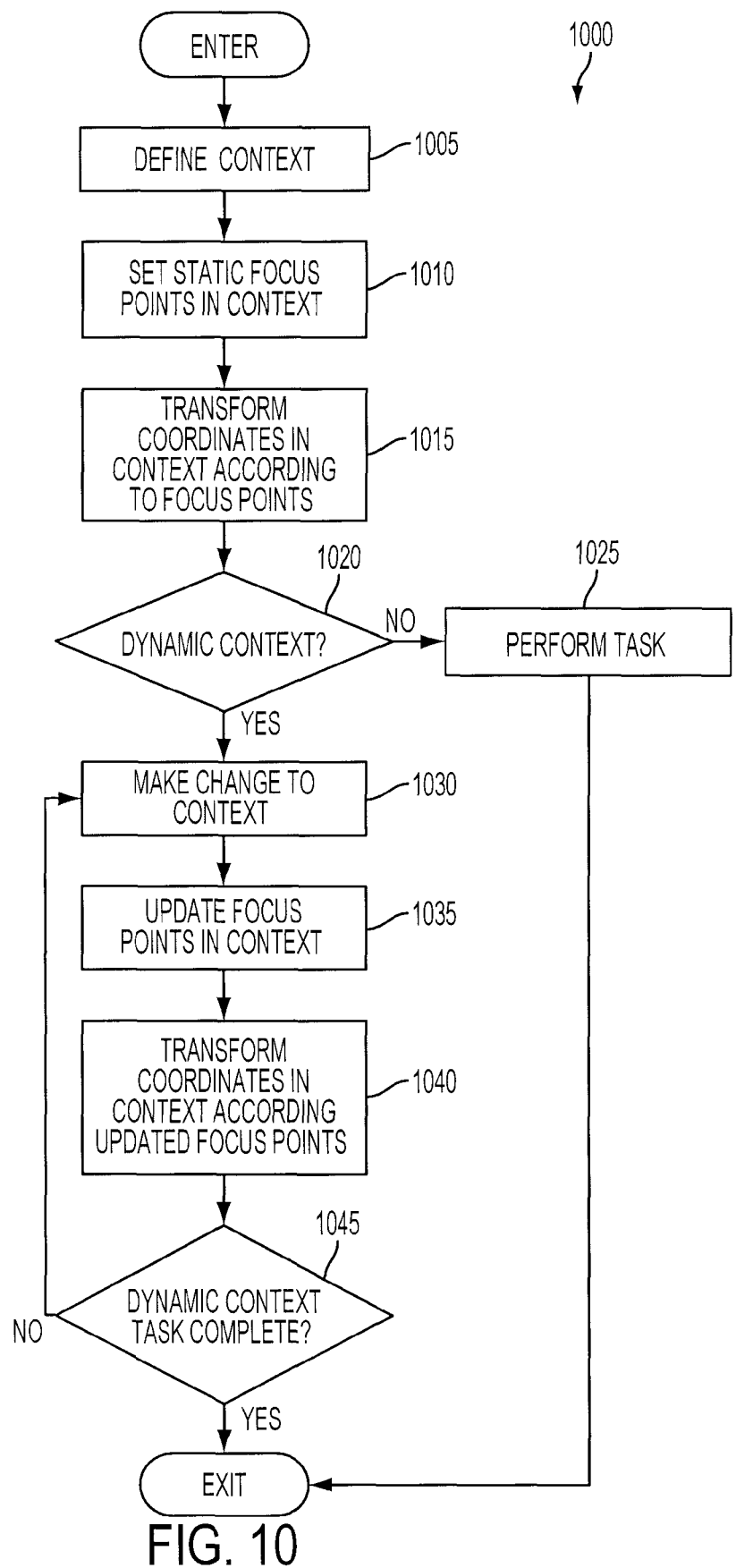
FIG. 10 is a flow diagram of an exemplary embodiment of the present inventive concept.

Referring to FIG. 10, there is illustrated an exemplary non-linear editing process 1000 consistent with the present invention. Upon entry to the method, a context is defined in operation 1005. As described above, a context may be defined by, for example, selection of an editing environment, and the inclusion of a graphical element into the context. In operation 1010, static focus points are established in the context. In operation 1015, the spatial transformation data is applied about the static focus points. At operation 1020, it is determined whether the context is a dynamic context. If it is determined that the context is not a dynamic context, the process 1000 shifts to operation 1025, whereby a user task may be performed. If it is determined at operation 1020 that the context is a dynamic context, the process 1000 shifts to operation 1030, whereby a change is made to the context, such as by the addition or relocation of a graphical element. In operation 1035, the location of the dynamic focus point is updated, and in operation 1040, the coordinates of the canvas 230 are transformed about the updated location of the focus point. It is then determined at operation 1045 whether the task using the dynamic context has been completed. If not, the process 1000 repeats at operation 1030. If it is determined at operation 1045 that the task has been completed, the process is exited.

Certain embodiments of the present general inventive concept provide for the functional components to manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any medium on which the instructions may be encoded and then subsequently retrieved, decoded and executed by a processor, including electrical, magnetic and optical storage devices, and wired, wireless, optical and acoustical communication channels. The computer readable medium may include either or both of persistent storage, referred to herein as "computer-readable recording media" and as spatiotemporal storage, referred to herein as "computer-readable transmission media". Examples of computer-readable recording media include, but not limited to, read-only memory (ROM), random-access memory (RAM), and other electrical storage; CD-ROM, DVD, and other optical storage; and magnetic tape, floppy disks, hard disks and other magnetic storage. The computer-readable recording media may be distributed across components, to include such distribution through storage systems interconnected through a communication network. The computer-readable transmission media may transmit encoded instructions on electromagnetic carrier waves or signals, or as acoustic signals through acoustically transmissive media. Moreover, the processor instructions may be derived from algorithmic constructions of the present general inventive concept in various programming languages, the mere contemplation of which illustrates the numerous realizable abstractions of the present general inventive concept.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. A graphic editor apparatus comprising:
   a display interface to display in a bounded region thereof a plurality of graphical representations of data items in a first distribution of information-conveying states;
   a context data processor to establish a context portion to include at least one of the data items;
   a display data processor to render the graphical representations of the data items into a second distribution of the information-conveying states across the bounded region of the display interface to concurrently:
   (a) increase an amount of information conveyed to a user by the graphical representation of the data item in the context portion, and
   (b) reduce an amount of information conveyed to a user by the graphical representations of the data items outside the context portion, the graphical representations of the data items remaining visible in the bounded region of the display interface; and
   at least one user control to modify a data item in the bounded region of the display interface in the second distribution of the information-conveying states of the graphical representations of the data items, wherein the second distribution of information-conveying states includes at least one different information-conveying state selected from a plurality of information-conveying states maintained for a data item, the different information-conveying state replacing an original information-conveying state of the data item.

2. The graphic editor apparatus as recited in claim 1, wherein the display data processor redistributes the information-conveying states through a spatial transform such that the graphical representations of the plurality of data items remain visible in the bounded region of the display interface.

3. The graphic editor apparatus as recited in claim 2, wherein the spatial transform is a non-linear zoom transform, whereby the graphical representation of the data item in the context portion is spatially expanded about a focus point and the graphical representations of the data items outside the context are spatially contracted to remain visible in the bounded region of the display interface.

4. The graphic editor apparatus as recited in claim 3 further including a transform data memory from which the display data processor retrieves a transformed coordinate according to the non-linear zoom transform for a normal coordinate, and vice-versa.

5. The graphic editor apparatus as recited in claim 4, wherein the transformed coordinate is stored in the transform data memory in at least one lookup table.

6. The graphic editor apparatus as recited in claim 5, wherein the display data processor sequentially applies the non-linear zoom transform stored in separate lookup tables to each of a plurality dimensions represented in the bounded region of the display interface.

7. The graphic editor apparatus as recited in claim 3, wherein the context data processor defines a dynamic context in which at least one graphical representation of a corresponding data item is either moved in or added to the dynamic context.

8. The graphic editor apparatus as recited in claim 7, wherein a location of the focus point in the dynamic context is updated during moving of, or the addition of, the at least one graphical representation of the data item.

9. The graphic editor apparatus as recited in claim 8, wherein the non-linear zoom transform is applied to each of separate bounded regions of the display interface.

10. The graphic editor apparatus as recited in claim 9, wherein graphical representations of data items spanning more than one of the bounded regions of the display interface is made visually continuous across the bounded regions.

11. The graphic editor apparatus as recited in claim 8, wherein the location of the focus point in the dynamic context is constrained by a confinement region defined by the context portion.

12. A graphic editing interface comprising:
a display device having a canvas region displayed thereon to edit a plurality of graphical abstractions of data items;
a processor to establish a context portion to include at least one data item associated therewith and to render graphical abstractions of the data items such that the graphical abstraction of the data item in the context portion is displayed with greater visual prominence than the graphical abstractions of the data items outside the context portion and the graphical abstractions of all of the data items outside the context portion are rendered to be displayed with a reduction in visual prominence relative to an initial prominence while remaining visible in the canvas region; and
at least one user control to modify a data item in the canvas region subsequent to the graphical abstraction of the data item in the context portion being displayed with greater visual prominence than the graphical abstractions of the data items outside the context portion, wherein at least one graphical abstraction is selected from a plurality of graphical abstractions maintained for a data item to replace an original graphical abstraction of the data item.

13. A graphical editing interface to an electronic circuit design system comprising:
a canvas region of a display interface to edit a plurality of graphical abstractions of circuit data;
a context data processor to establish a context portion including at least one circuit data item;
a display data processor to render graphical abstractions of the circuit data items such that the graphical abstraction of the circuit data item in the context portion is displayed with greater visual prominence than the graphical abstractions of the circuit data items outside the context portion and the graphical abstractions of all of the circuit data items outside the context portion are rendered to be displayed with a reduction in visual prominence relative to an initial prominence while remaining visible in the canvas region; and
at least one user control to modify a circuit data item on the canvas subsequent to the graphical abstraction of the circuit data item in the context portion being displayed with greater visual prominence than the graphical abstractions of the circuit data items outside the context portion, wherein at least one graphical abstraction is selected from a plurality of graphical abstractions maintained for a data item to replace an original graphical abstraction of the data item.

14. The graphical editing interface as recited in claim 13, wherein the display data processor renders the graphical abstractions of the circuit data in the canvas region through a non-linear zoom transform, whereby the graphical abstraction of the circuit data item in the context portion is spatially expanded and the graphical abstractions of the circuit data items outside the context portion are spatially contracted to remain visible in the canvas region.

15. The graphical editing interface as recited in claim 14 further including a transform data memory having stored therein at least one lookup table from which the display data processor retrieves a non-linear coordinate according to the non-linear zoom transform for a normal coordinate, and vice-versa.

16. The graphical editing interface as recited in claim 15, wherein the display data processor sequentially applies the non-linear zoom transform stored in separate lookup tables to each of a plurality dimensions represented in the canvas region.

17. The graphical editing interface as recited in claim 14, wherein the context data processor defines a dynamic context in which at least one graphical abstraction of a corresponding circuit data item is either moved in or added to the dynamic context.

18. The graphical editing interface as recited in claim 17, wherein a location of the focus point in the dynamic context is updated during the moving of, or the addition of, the at least one graphical abstraction of the circuit data item.

19. A method of editing graphic data comprising: actuating a computer processor to:
display a plurality of graphical elements in a bounded area of a display screen, each of the graphical elements having assigned thereto an information-conveying state to form a distribution of information-conveying states of the plurality of graphical elements across the bounded area of the display screen;
establish one or more of the graphical elements as belonging to a context portion and excluding one or more of the graphical elements from the context portion;
modify the distribution of information-conveying states of the plurality of graphical elements such that the graphical elements in the context portion are displayed with greater visual prominence than the graphical elements outside the context portion and all of the graphical elements outside the context portion are displayed with a reduction in visual prominence relative to an initial prominence while remaining visible in the bounded region of the display screen; and
modify the graphical elements in the bounded area of the display screen subsequent to the modifying of the distribution of information-conveying states, wherein the modified distribution of information-conveying states includes at least one different information-conveying state for a graphical element, the different information-conveying state being selected from a plurality of information-conveying states maintained for a graphical element, the different information-conveying state replacing an original information-conveying state of the graphical element.

20. The method of editing graphic data as recited in claim 19, wherein the modifying of the distribution of information-conveying states of the plurality of graphical elements includes applying a non-linear zoom transform about a focus point in the context portion.

21. A non-transitory computer readable medium having encoded thereon processor instructions that, when executed by a processor, performs the method recited in claim 19.

* * * * *